US008193702B2

(12) United States Patent
Lenk et al.

(10) Patent No.: US 8,193,702 B2
(45) Date of Patent: Jun. 5, 2012

(54) METHOD OF LIGHT DISPERSION AND PREFERENTIAL SCATTERING OF CERTAIN WAVELENGTHS OF LIGHT-EMITTING DIODES AND BULBS CONSTRUCTED THEREFROM

(75) Inventors: Ronald J. Lenk, Redwood City, CA (US); Carol Lenk, Redwood City, CA (US)

(73) Assignee: Switch Bulb Company, Inc., San Jose, CA (US)

( * ) Notice: Subject to any disclaimer, the term of this patent is extended or adjusted under 35 U.S.C. 154(b) by 5 days.

(21) Appl. No.: 12/299,088

(22) PCT Filed: Apr. 27, 2007

(86) PCT No.: PCT/US2007/010467

§ 371 (c)(1), (2), (4) Date: Oct. 30, 2008

(87) PCT Pub. No.: WO2007/130359

PCT Pub. Date: Nov. 15, 2007

(65) Prior Publication Data

US 2009/0200939 A1 Aug. 13, 2009

(51) Int. Cl.
*H01L 23/32* (2006.01)
*H01L 31/0232* (2006.01)

(52) U.S. Cl. ......................... 313/506; 313/512; 313/498

(58) Field of Classification Search ........... 313/498–512
See application file for complete search history.

(56) References Cited

U.S. PATENT DOCUMENTS

| | | | |
|---|---|---|---|
| 3,962,675 | A | 6/1976 | Rowley et al. |
| 4,025,290 | A | 5/1977 | Giangiulio |
| 4,039,885 | A | 8/1977 | van Boekhold et al. |
| 4,077,076 | A | 3/1978 | Masters |
| 4,211,955 | A | 7/1980 | Ray |
| 4,271,458 | A | 6/1981 | George, Jr. |

(Continued)

FOREIGN PATENT DOCUMENTS

EP 0658933 B1 10/2001

(Continued)

OTHER PUBLICATIONS

International Search Report dated Aug. 27, 2008 issued in International Application No. PCT/US2007/10467.

(Continued)

*Primary Examiner* — Joseph L Williams
*Assistant Examiner* — Nathaniel Lee
(74) *Attorney, Agent, or Firm* — Morrison & Foerster LLP

(57) ABSTRACT

A method for preferential scattering of certain wavelengths of light and/or dispersing light in an LED or LED bulb. The method includes emitting light from at least one LED die, and scattering the light from the at least one LED die by dispersing a plurality of particles having a size a fraction of at least one dominant wavelength of the light from the at least one LED die in the LED outer shell or in an LED bulb or in an at least one shell of an LED bulb. Alternatively, the method includes emitting light from the at least one LED die, and dispersing the light from the at least one LED die by distributing a plurality of particles having a size one to a few times larger than a dominant wavelength of the light from the LED in an outer shell, or body of the LED bulb.

24 Claims, 2 Drawing Sheets

U.S. PATENT DOCUMENTS

| | | | |
|---|---|---|---|
| 4,290,095 | A | 9/1981 | Schmidt |
| 4,325,107 | A | 4/1982 | MacLeod |
| 4,336,855 | A | 6/1982 | Chen |
| 4,346,329 | A | 8/1982 | Schmidt |
| 4,405,744 | A | 9/1983 | Greinecker |
| 4,511,952 | A | 4/1985 | Vanbragt |
| 4,539,516 | A | 9/1985 | Thompson |
| 4,611,512 | A | 9/1986 | Honda |
| 4,647,331 | A | 3/1987 | Koury, Jr. et al. |
| 4,650,509 | A | 3/1987 | Vanbragt |
| 4,656,564 | A | 4/1987 | Felder |
| 4,658,532 | A | 4/1987 | McFarland et al. |
| 4,663,558 | A | 5/1987 | Endo |
| 4,727,289 | A | 2/1988 | Uchida |
| 4,728,999 | A | 3/1988 | Dannatt et al. |
| 4,840,383 | A | 6/1989 | Lombardo |
| 4,843,266 | A | 6/1989 | Szanto et al. |
| 4,875,852 | A | 10/1989 | Ferren |
| 4,876,632 | A | 10/1989 | Osterhout et al. |
| 4,904,991 | A | 2/1990 | Jones |
| 4,916,352 | A | 4/1990 | Haim |
| 4,942,685 | A | 7/1990 | Lin |
| 4,947,300 | A | 8/1990 | Wen |
| 4,967,330 | A | 10/1990 | Bell |
| 4,994,705 | A | 2/1991 | Linder et al. |
| 5,008,588 | A | 4/1991 | Nakahara |
| 5,065,226 | A | 11/1991 | Kluitmans et al. |
| 5,065,291 | A | 11/1991 | Frost et al. |
| 5,075,372 | A | 12/1991 | Hille et al. |
| 5,119,831 | A | 6/1992 | Robin et al. |
| 5,136,213 | A | 8/1992 | Sacchetti |
| 5,140,220 | A | 8/1992 | Hasegawa |
| 5,224,773 | A | 7/1993 | Arimura |
| 5,237,490 | A | 8/1993 | Ferng |
| 5,303,124 | A | 4/1994 | Wrobel |
| 5,358,880 | A | 10/1994 | Lebby et al. |
| 5,377,000 | A | 12/1994 | Berends |
| 5,405,208 | A | 4/1995 | Hsieh |
| 5,463,280 | A | 10/1995 | Johnson |
| 5,493,184 | A | 2/1996 | Wood et al. |
| 5,514,627 | A | 5/1996 | Lowery |
| 5,528,474 | A | 6/1996 | Roney |
| 5,561,347 | A | 10/1996 | Nakamura et al. |
| 5,585,783 | A | 12/1996 | Hall |
| 5,622,423 | A | 4/1997 | Lee |
| 5,630,660 | A | 5/1997 | Chen |
| 5,662,490 | A | 9/1997 | Ogawa |
| 5,664,866 | A | 9/1997 | Reniger et al. |
| 5,667,295 | A | 9/1997 | Tsui |
| 5,684,354 | A | 11/1997 | Gleckman |
| 5,685,637 | A | 11/1997 | Chapman et al. |
| 5,688,042 | A | 11/1997 | Madadi et al. |
| 5,726,535 | A | 3/1998 | Yan |
| 5,807,157 | A | 9/1998 | Penjuke |
| 5,887,967 | A | 3/1999 | Chang |
| 5,890,794 | A | 4/1999 | Abtahi et al. |
| 5,892,325 | A | 4/1999 | Gleckman |
| 5,899,557 | A | 5/1999 | McDermott |
| 5,929,568 | A | 7/1999 | Eggers |
| 5,931,562 | A | 8/1999 | Arato |
| 5,931,570 | A | 8/1999 | Yamuro |
| 5,936,599 | A | 8/1999 | Reymond |
| 5,941,626 | A | 8/1999 | Yamuro |
| 5,947,588 | A | 9/1999 | Huang |
| 5,952,916 | A | 9/1999 | Yamabe |
| 5,963,126 | A | 10/1999 | Karlin et al. |
| 5,982,059 | A | 11/1999 | Anderson |
| 5,984,494 | A | 11/1999 | Chapman et al. |
| 6,003,033 | A | 12/1999 | Amano et al. |
| 6,043,591 | A | 3/2000 | Gleckman |
| 6,087,764 | A | 7/2000 | Matei |
| 6,095,671 | A | 8/2000 | Hutain |
| 6,102,809 | A | 8/2000 | Nichols |
| 6,120,312 | A | 9/2000 | Shu |
| 6,123,631 | A | 9/2000 | Ginder |
| 6,147,367 | A | 11/2000 | Yang et al. |
| 6,158,451 | A | 12/2000 | Wu |
| 6,183,310 | B1 | 2/2001 | Shu |
| 6,184,628 | B1 | 2/2001 | Ruthenberg |
| 6,227,679 | B1 | 5/2001 | Zhang et al. |
| 6,227,685 | B1 | 5/2001 | McDermott |
| 6,254,939 | B1 | 7/2001 | Cowan et al. |
| 6,258,699 | B1 | 7/2001 | Chang et al. |
| 6,268,801 | B1 | 7/2001 | Wu |
| 6,273,580 | B1 | 8/2001 | Coleman et al. |
| 6,276,822 | B1 | 8/2001 | Bedrosian et al. |
| 6,313,892 | B2 | 11/2001 | Gleckman |
| 6,316,911 | B1 | 11/2001 | Moskowitz et al. |
| 6,332,692 | B1 | 12/2001 | McCurdy |
| 6,338,647 | B1 | 1/2002 | Fernandez et al. |
| 6,357,902 | B1 | 3/2002 | Horowitz |
| 6,382,582 | B1 | 5/2002 | Brown |
| 6,426,704 | B1 | 7/2002 | Hutchison |
| 6,471,562 | B1 | 10/2002 | Liu |
| 6,478,449 | B2 | 11/2002 | Lee et al. |
| 6,480,389 | B1 | 11/2002 | Shie et al. |
| 6,488,392 | B1 | 12/2002 | Lu |
| 6,496,237 | B1 | 12/2002 | Gleckman |
| 6,504,301 | B1 | 1/2003 | Lowery |
| 6,513,955 | B1 | 2/2003 | Waltz |
| 6,528,954 | B1 | 3/2003 | Lys et al. |
| 6,534,988 | B2 | 3/2003 | Flory, IV |
| 6,541,800 | B2 | 4/2003 | Barnett et al. |
| 6,547,417 | B2 | 4/2003 | Lee |
| 6,568,834 | B1 | 5/2003 | Scianna |
| 6,582,100 | B1 | 6/2003 | Hochstein et al. |
| 6,608,272 | B2 | 8/2003 | Garcia |
| 6,612,712 | B2 | 9/2003 | Nepil |
| 6,619,829 | B1 | 9/2003 | Chen |
| 6,626,557 | B1 | 9/2003 | Taylor |
| 6,639,360 | B2 | 10/2003 | Roberts |
| 6,655,810 | B2 | 12/2003 | Hayashi et al. |
| 6,659,632 | B2 | 12/2003 | Chen |
| 6,685,852 | B2 | 2/2004 | Setlur |
| 6,709,132 | B2 | 3/2004 | Ishibashi |
| 6,711,426 | B2 | 3/2004 | Benaron et al. |
| 6,713,961 | B2 | 3/2004 | Honda et al. |
| 6,734,633 | B2 | 5/2004 | Matsuba et al. |
| 6,741,029 | B2 | 5/2004 | Matsubara et al. |
| 6,742,907 | B2 | 6/2004 | Funamoto et al. |
| 6,746,885 | B2 | 6/2004 | Cao |
| 6,750,824 | B1 | 6/2004 | Shen |
| 6,773,192 | B1 | 8/2004 | Chao |
| 6,789,348 | B1 | 9/2004 | Kneller et al. |
| 6,791,259 | B1 * | 9/2004 | Stokes et al. .................. 313/503 |
| 6,791,283 | B2 | 9/2004 | Bowman et al. |
| 6,793,362 | B2 | 9/2004 | Tai |
| 6,793,363 | B2 | 9/2004 | Jensen |
| 6,796,698 | B2 | 9/2004 | Sommers et al. |
| 6,805,461 | B2 | 10/2004 | Witte |
| 6,819,049 | B1 | 11/2004 | Bohmer et al. |
| 6,819,056 | B2 | 11/2004 | Lin |
| 6,828,590 | B2 | 12/2004 | Hsiung |
| 6,864,513 | B2 | 3/2005 | Lin et al. |
| 6,864,554 | B2 | 3/2005 | Lin |
| 6,881,980 | B1 | 4/2005 | Ting |
| 6,886,963 | B2 | 5/2005 | Lodhie |
| 6,903,380 | B2 | 6/2005 | Barnett et al. |
| 6,905,231 | B2 | 6/2005 | Dickie |
| 6,910,794 | B2 | 6/2005 | Rice |
| 6,911,678 | B2 | 6/2005 | Fujisawa et al. |
| 6,911,915 | B2 | 6/2005 | Wu et al. |
| 6,926,973 | B2 | 8/2005 | Suzuki et al. |
| 6,927,683 | B2 | 8/2005 | Sugimoto et al. |
| 6,932,638 | B1 | 8/2005 | Burrows et al. |
| 6,936,857 | B2 | 8/2005 | Doxsee et al. |
| 6,943,357 | B2 | 9/2005 | Srivastava et al. |
| 6,948,829 | B2 | 9/2005 | Verdes et al. |
| 6,956,243 | B1 | 10/2005 | Chin |
| 6,963,688 | B2 | 11/2005 | Nath |
| 6,964,878 | B2 | 11/2005 | Horng et al. |
| 6,967,445 | B1 | 11/2005 | Jewell et al. |
| 6,971,760 | B2 | 12/2005 | Archer et al. |
| 6,974,924 | B2 | 12/2005 | Agnatovech et al. |
| 6,982,518 | B2 | 1/2006 | Chou et al. |
| 6,983,506 | B1 | 1/2006 | Brown |
| 7,022,260 | B2 | 4/2006 | Morioka |

7,042,150 B2 5/2006 Yasuda
7,058,103 B2 6/2006 Ishida et al.
D525,374 S 7/2006 Maxik et al.
7,073,920 B2 7/2006 Konkle, Jr. et al.
7,074,631 B2 7/2006 Erchak et al.
7,075,112 B2 7/2006 Roberts
7,078,732 B1 7/2006 Reeh
D527,119 S 8/2006 Maxik et al.
7,086,756 B2 8/2006 Maxik
7,086,767 B2 8/2006 Sidwell
D528,673 S 9/2006 Maxik et al.
D531,740 S 11/2006 Maxik
D532,532 S 11/2006 Maxik
7,138,666 B2 11/2006 Erchak et al.
7,161,311 B2 1/2007 Mueller et al.
7,186,016 B2 3/2007 Jao
7,213,934 B2 5/2007 Zarian
7,239,080 B2 7/2007 Ng et al.
7,241,039 B2 7/2007 Hulse
7,246,919 B2 7/2007 Porchia
7,261,454 B2 8/2007 Ng
7,270,446 B2 9/2007 Chang
7,288,798 B2 10/2007 Chang
7,315,119 B2 1/2008 Ng
7,319,293 B2 1/2008 Maxik
7,344,279 B2 3/2008 Mueller et al.
7,350,933 B2 4/2008 Ng et al.
7,367,692 B2 5/2008 Maxik
7,396,142 B2 7/2008 Laizure, Jr. et al.
7,489,031 B2 2/2009 Roberts
7,513,669 B2 4/2009 Chua et al.
7,677,765 B2 3/2010 Tajul et al.
2001/0008436 A1 7/2001 Gleckman
2001/0009400 A1 7/2001 Maeno et al.
2001/0019134 A1 9/2001 Chang et al.
2001/0026447 A1 10/2001 Herrera
2001/0035264 A1 11/2001 Padmanabhan
2001/0053077 A1 12/2001 Anwly-Davies et al.
2002/0021573 A1 2/2002 Zhang
2002/0039872 A1 4/2002 Asai et al.
2002/0068775 A1 6/2002 Munzenberger
2002/0070449 A1 6/2002 Yagi et al.
2002/0085379 A1 7/2002 Han et al.
2002/0093287 A1 7/2002 Chen
2002/0097586 A1 7/2002 Horowitz
2002/0117692 A1 8/2002 Lin
2002/0126491 A1 9/2002 Chen
2002/0145863 A1 10/2002 Stultz
2002/0149312 A1 10/2002 Roberts et al.
2002/0153829 A1 10/2002 Asai et al.
2002/0154449 A1 10/2002 Hsich
2002/0176246 A1 11/2002 Chen
2002/0183438 A1 12/2002 Amarasekera et al.
2002/0186538 A1 12/2002 Kase et al.
2002/0191416 A1 12/2002 Wesson
2003/0025449 A1 2/2003 Rossner
2003/0038596 A1* 2/2003 Ho ................................ 313/512
2003/0043579 A1 3/2003 Rong et al.
2003/0048632 A1 3/2003 Archer
2003/0058658 A1 3/2003 Lee
2003/0072156 A1 4/2003 Pohlert
2003/0079387 A1 5/2003 Derose
2003/0111955 A1 6/2003 McNulty et al.
2003/0128629 A1 7/2003 Stevens
2003/0142508 A1 7/2003 Lee
2003/0164666 A1 9/2003 Crunk
2003/0185020 A1 10/2003 Stekelenburg
2003/0193841 A1 10/2003 Crunk
2003/0201903 A1 10/2003 Shen
2003/0230045 A1 12/2003 Krause, Sr. et al.
2003/0231510 A1 12/2003 Tawa et al.
2004/0001338 A1 1/2004 Pine
2004/0004435 A1 1/2004 Hsu
2004/0004441 A1 1/2004 Yano
2004/0007980 A1 1/2004 Shibata
2004/0008525 A1 1/2004 Shibata
2004/0014414 A1 1/2004 Horie et al.
2004/0039274 A1 2/2004 Benaron et al.
2004/0039764 A1 2/2004 Gonikberg et al.
2004/0056600 A1 3/2004 Lapatovich et al.
2004/0085017 A1 5/2004 Lee
2004/0085758 A1 5/2004 Deng
2004/0101802 A1 5/2004 Scott
2004/0105262 A1 6/2004 Tseng et al.
2004/0113549 A1 6/2004 Roberts et al.
2004/0114352 A1 6/2004 Jensen
2004/0114367 A1 6/2004 Li
2004/0125034 A1 7/2004 Shen
2004/0125515 A1 7/2004 Popovich
2004/0127138 A1 7/2004 Huang
2004/0179355 A1 9/2004 Gabor
2004/0183458 A1 9/2004 Lee
2004/0187313 A1 9/2004 Zirk et al.
2004/0189262 A1 9/2004 McGrath
2004/0190305 A1 9/2004 Arik et al.
2004/0201673 A1 10/2004 Asai
2004/0207334 A1 10/2004 Lin
2004/0208002 A1 10/2004 Wu
2004/0211589 A1 10/2004 Chou et al.
2004/0217693 A1 11/2004 Duggal et al.
2004/0233661 A1 11/2004 Taylor
2004/0245912 A1 12/2004 Thurk
2004/0257804 A1 12/2004 Lee
2004/0264192 A1 12/2004 Nagata et al.
2005/0007010 A1 1/2005 Lee
2005/0007770 A1 1/2005 Bowman et al.
2005/0011481 A1 1/2005 Compere et al.
2005/0015029 A1 1/2005 Kim
2005/0018424 A1 1/2005 Popovich
2005/0023540 A1 2/2005 Yoko et al.
2005/0030761 A1 2/2005 Burgess
2005/0031281 A1 2/2005 Nath
2005/0036299 A1 2/2005 Tsai
2005/0036616 A1 2/2005 Huang et al.
2005/0047170 A1 3/2005 Hilburger et al.
2005/0052885 A1* 3/2005 Wu ................................ 362/565
2005/0057187 A1 3/2005 Catalano
2005/0063185 A1 3/2005 Monjo et al.
2005/0067343 A1 3/2005 Zulauf et al.
2005/0068776 A1 3/2005 Ge
2005/0084229 A1 4/2005 Babbitt et al.
2005/0099787 A1 5/2005 Hayes
2005/0105302 A1 5/2005 Hofmann et al.
2005/0110191 A1 5/2005 Lin
2005/0110384 A1 5/2005 Peterson
2005/0111234 A1 5/2005 Martin et al.
2005/0141221 A1 6/2005 Yu
2005/0151664 A1 7/2005 Kolish et al.
2005/0152136 A1 7/2005 Konkle, Jr. et al.
2005/0162864 A1 7/2005 Verdes et al.
2005/0174065 A1 8/2005 Janning
2005/0174769 A1 8/2005 Yong et al.
2005/0174780 A1 8/2005 Park
2005/0179358 A1 8/2005 Soules et al.
2005/0179379 A1 8/2005 Kim
2005/0180136 A9 8/2005 Popovich
2005/0180137 A1 8/2005 Hsu
2005/0207152 A1* 9/2005 Maxik ........................... 362/231
2005/0207159 A1 9/2005 Maxik
2005/0217996 A1 10/2005 Liu et al.
2005/0224829 A1 10/2005 Negley
2005/0230691 A1 10/2005 Amiotti et al.
2005/0233485 A1 10/2005 Shishov et al.
2005/0237005 A1 10/2005 Maxik
2005/0243539 A1 11/2005 Evans et al.
2005/0243550 A1 11/2005 Stekelenburg
2005/0243552 A1 11/2005 Maxik
2005/0255026 A1 11/2005 Barker et al.
2005/0258446 A1 11/2005 Raos et al.
2005/0259419 A1 11/2005 Sandoval
2005/0265039 A1 12/2005 Lodhie et al.
2005/0270780 A1 12/2005 Zhang
2005/0276034 A1 12/2005 Malpetti
2005/0276051 A1 12/2005 Caudle et al.
2005/0276053 A1 12/2005 Nortrup et al.
2005/0276072 A1 12/2005 Hayashi et al.
2005/0285494 A1 12/2005 Cho et al.
2006/0002110 A1 1/2006 Dowling et al.

| | | | | |
|---|---|---|---|---|
| 2006/0007410 | A1 | 1/2006 | Masuoka | |
| 2006/0034077 | A1 | 2/2006 | Chang | |
| 2006/0044803 | A1 | 3/2006 | Edwards | |
| 2006/0050514 | A1 | 3/2006 | Opolka | |
| 2006/0061985 | A1 | 3/2006 | Elkins | |
| 2006/0071591 | A1 | 4/2006 | Takezawa et al. | |
| 2006/0092644 | A1 | 5/2006 | Mok et al. | |
| 2006/0145172 | A1 | 7/2006 | Su | |
| 2006/0152946 | A1 | 7/2006 | Chien | |
| 2006/0176699 | A1 | 8/2006 | Crunk | |
| 2006/0187653 | A1 | 8/2006 | Olsson | |
| 2006/0193121 | A1 | 8/2006 | Kamoshita | |
| 2006/0193130 | A1 | 8/2006 | Ishibashi | |
| 2006/0198147 | A1 | 9/2006 | Ge | |
| 2006/0208260 | A1 | 9/2006 | Sakuma et al. | |
| 2006/0226772 | A1 | 10/2006 | Tan | |
| 2006/0243997 | A1 | 11/2006 | Yang | |
| 2006/0250802 | A1 | 11/2006 | Herold | |
| 2006/0255353 | A1 | 11/2006 | Taskar | |
| 2006/0261359 | A1 | 11/2006 | Huang | |
| 2006/0273340 | A1 | 12/2006 | Lv | |
| 2006/0274524 | A1 | 12/2006 | Chang et al. | |
| 2007/0018181 | A1 | 1/2007 | Steen | |
| 2007/0031685 | A1 * | 2/2007 | Ko et al. | 428/447 |
| 2007/0057364 | A1 | 3/2007 | Wang et al. | |
| 2007/0086189 | A1 | 4/2007 | Raos et al. | |
| 2007/0090391 | A1 | 4/2007 | Diamantidis | |
| 2007/0090737 | A1 | 4/2007 | Hu et al. | |
| 2007/0120879 | A1 | 5/2007 | Kanade et al. | |
| 2007/0125982 | A1 | 6/2007 | Tian | |
| 2007/0139949 | A1 | 6/2007 | Tanda | |
| 2007/0291490 | A1 | 12/2007 | Tajul | |
| 2008/0013316 | A1 | 1/2008 | Chiang | |
| 2008/0048200 | A1 | 2/2008 | Mueller | |
| 2008/0070331 | A1 | 3/2008 | Ke | |
| 2009/0001372 | A1 | 1/2009 | Arik et al. | |
| 2009/0324875 | A1 | 12/2009 | Heikkila | |
| 2010/0177534 | A1 | 7/2010 | Ryu et al. | |

FOREIGN PATENT DOCUMENTS

| | | | |
|---|---|---|---|
| JP | 63-086484 | | 4/1988 |
| JP | 07-099372 | A | 4/1994 |
| JP | 3351103 | B2 | 11/2002 |
| WO | 02/061805 | A2 | 8/2002 |
| WO | 2004/100213 | A2 | 11/2004 |
| WO | 2005/060309 | A2 | 6/2005 |
| WO | 2007/069119 | A1 | 6/2007 |
| WO | 2007/130357 | A2 | 11/2007 |
| WO | 2007/130359 | A2 | 11/2007 |
| WO | 2009/054948 | A1 | 4/2009 |

OTHER PUBLICATIONS

Preliminary Report on Patentability dated Nov. 27, 2008 issued in International Application No. PCT/US2007/10467.

International Preliminary Report on Patentability received for PCT Patent Application No. PCT/US2009/005030, mailed on Mar. 24, 2011, 9 pages.

Office Action received for Chinese Patent Application No. 200780015112.2, mailed on Apr. 8, 2010, 9 pages of Office Action and 16 pages of English Translation.

Office Action received for Chinese Patent Application No. 200780015303.9, mailed on Jun. 8, 2010, 8 pages of English Translation.

Office Action received for NZ Patent Application No. 573336, mailed on Apr. 19, 2010, 2 pages.

International Preliminary Report on Patentability received for PCT Patent Application No. PCT/US2007/010469, mailed on Nov. 4, 2008,12 pages.

International Search Report received for PCT Patent Application No. PCT/US2007/10469, mailed on Aug. 7, 2008, 2 pages.

International Preliminary Report on Patentability received for PCT Patent Application No. PCT/US2008/011984, mailed on May 6, 2010, 5 pages.

International Search Report received for PCT Patent Application No. PCT/US2008/011984, mailed on Jan. 15, 2009, 1 page.

International Search Report received for PCT Patent Application No. PCT/US2009/005030, mailed on Nov. 12, 2009, 2 pages.

Ryu et al., "Liquid Crystalline Assembly of Rod-Coil Molecules", Structure & Bonding, vol. 128, 2008, pp. 63-98.

Non Final Office Action received for U.S. Appl. No. 12/299,049, mailed on Jun. 16, 2011 , 74 pages.

Final Office Action received for U.S. Appl. No. 12/299,049, mailed on Jan. 4, 2012, 24 pages.

* cited by examiner

METHOD OF LIGHT DISPERSION AND PREFERENTIAL SCATTERING OF CERTAIN WAVELENGTHS OF LIGHT-EMITTING DIODES AND BULBS CONSTRUCTED THEREFROM

CROSS-REFERENCE TO RELATED APPLICATION

This application is filed under 35 U.S.C. X371 and claims priority to International Application Serial No. PCT/US2007/010467, filed Apr. 27, 2007, which claims priority to U.S. Patent Provisional Application No. 60/797,118 filed May 2, 2006 which is incorporated herein by this reference in its entirety.

FIELD OF THE INVENTION

The present invention relates to light-emitting diodes (LEDs), and to replacement of bulbs used for lighting by LED bulbs. More particularly, it relates to the preferential scattering of certain wavelengths of light and dispersion of the light generated by the LEDs in order to permit the LEDs to more closely match the color of incandescent bulbs, or to the preferential scattering of certain wavelengths of light and dispersion of the light of the LEDs used in the replacement bulbs to match the light color and spatial pattern of the light of the bulb being replaced.

BACKGROUND OF THE INVENTION

An LED consists of a semi-conductor junction, which emits light due to a current flowing through the junction. At first sight, it would seem that LEDs should make an excellent replacement for the traditional tungsten filament incandescent bulb. At equal power, they give far more light output than do incandescent bulbs, or, what is the same thing, they use much less power for equal light; and their operational life is orders of magnitude larger, namely, 10-100 thousand hours vs. 1-2 thousand hours.

However, LEDs, and bulbs constructed from them, suffer from problems with color. "White" LEDs, which are typically used in bulbs, are today made from one of two processes. In the more common process, a blue-emitting LED is covered with a plastic cap, which, along with other possible optical properties, is coated with a phosphor that absorbs blue light and re-emits light at other wavelengths. A major research effort on the part of LED manufacturers is design of better phosphors, as phosphors presently known give rather poor color rendition. Additionally, these phosphors will saturate if over-driven with too much light, letting blue through and giving the characteristic blue color of over-driven white LEDs.

An additional problem with the phosphor process is that quantum efficiency of absorption and re-emission is less than unity, so that some of the light output of the LED is lost as heat, reducing the luminous efficacy of the LED, and increasing its thermal dissipation problems.

The other process for making a "white" LED today is the use of three (or more) LEDs, typically red, blue and green (RGB), which are placed in close enough proximity to each other to approximate a single source of any desired color. The problem with this process is that the different colors of LEDs age at different rates, so that the actual color produced varies with age. One additional method for getting a "white LED" is to use a colored cover over a blue or other colored LED, such as that made by JKL Lamps™. However, this involves significant loss of light.

LED bulbs have the same problems as do the LEDs they use, and further suffer from problems with the fact the LEDs are point sources. Attempts to do color adjustment by the bulb results in further light intensity loss.

Furthermore, an LED bulb ought to have its light output diffused, so that it has light coming out approximately uniformly over its surface, as does an incandescent bulb, to some level of approximation. In the past, LEDs have had diffusers added to their shells or bodies to spread out the light from the LED. Another method has been to roughen the surface of the LED package. Neither of these methods accomplishes uniform light distribution for an LED bulb, and may lower luminous efficiency. Methods of accomplishing approximate angular uniformity may also involve partially absorptive processes, further lowering luminous efficacy. Additionally, RGB (red, green, blue) systems may have trouble mixing their light together adequately at all angles.

This invention has the object of developing a means to create light from LEDs and LED bulbs that are closer to incandescent color than is presently available, with little or no loss in light intensity.

SUMMARY OF THE INVENTION

In one embodiment of the present invention, at least one shell that is normally used to hold a phosphor that converts the blue light from an LED die to "white" light contains particles of a size a faction of the dominant wavelength of the LED light, which particles Rayleigh scatter the light, causing preferential scattering of the red. In another embodiment of the present invention, the at least one shell has both the phosphor and the Rayleigh scatterers.

A further object of this invention is developing a means to create light from LED bulbs that is closer to incandescent color than is available using presently available-methods, with little or no loss in light intensity. In one embodiment of the present invention, the bulb contains particles of a size a fraction of the dominant wavelength of the LED light, which particles Rayleigh scatter the light, causing preferential scattering of the red. In another embodiment of the present invention, only the at least one shell of the bulb has the Rayleigh scatterers.

A yet further object of this invention is developing a means to disperse light approximately evenly over the surface of an LED bulb, with little or no loss in light intensity. In one embodiment of the present invention, the bulb contains particles with size one to a few times larger than the dominant wavelength of the LED light, or wavelengths of multiple LEDs in a color-mixing system, which particles Mie scatter the light, causing dispersion of the light approximately evenly over the surface of the bulb. In another embodiment of the present invention, only the at least one shell of the bulb has the Mie scatterers.

In accordance with another embodiment, the method comprises emitting light from at least one LED; and dispersing the light from the at least one LED by distributing a plurality of particles having a size one to a few times larger than a dominant wavelength of the light from the at least one LED or wavelengths of multiple LEDs in a color-mixing system in at least one shell of the LED bulb.

In accordance with a further embodiment, a method for creating light in an LED bulb that is closer to incandescent color than is available using presently available methods, the method comprises: emitting light from at least one LED; and preferential scattering of the red light from the at least one LED by dispersing a plurality of particles having a size a fraction of a dominant wavelength of the light from the at least one LED or wavelengths of multiple LEDs in a color-mixing system in an outer shell of the LED bulb.

In accordance with another embodiment, a method for dispersing light in an LED bulb, the method comprises: emitting light from at least one LED; and scattering the light from the at least one LED by distributing a plurality of particles having a size one to a few times larger than a dominant wavelength of the light from the at least one LED or wavelengths of multiple LEDs in a color-mixing system in an LED bulb.

In accordance with a further embodiment, a method for preferentially scattering light in an LED bulb, the method comprises emitting light from at least one LED; and scattering the light from the at least one LED by distributing a plurality of particles having a size one to a few times larger than a dominant wavelength of the light from the at least one LED or wavelengths of multiple LEDs in a color-mixing system in an LED bulb.

In accordance with another embodiment, an LED comprises an LED die; a shell encapsulating or partially encapsulating the die and having a plurality of particles dispersed therein, and wherein the plurality of particles are such a size as to disperse and/or preferentially scatter the wavelength of the light emitted from the LED.

In accordance with a further embodiment, an LED bulb comprises a bulb having at least one shell having a plurality of particle dispersed therein or in the bulb; at least one LED inside or optically coupled to said bulb; and wherein said plurality of particles are of such a size as to disperse and/or preferentially scatter the wavelength of the light emitted from the at least one LED.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
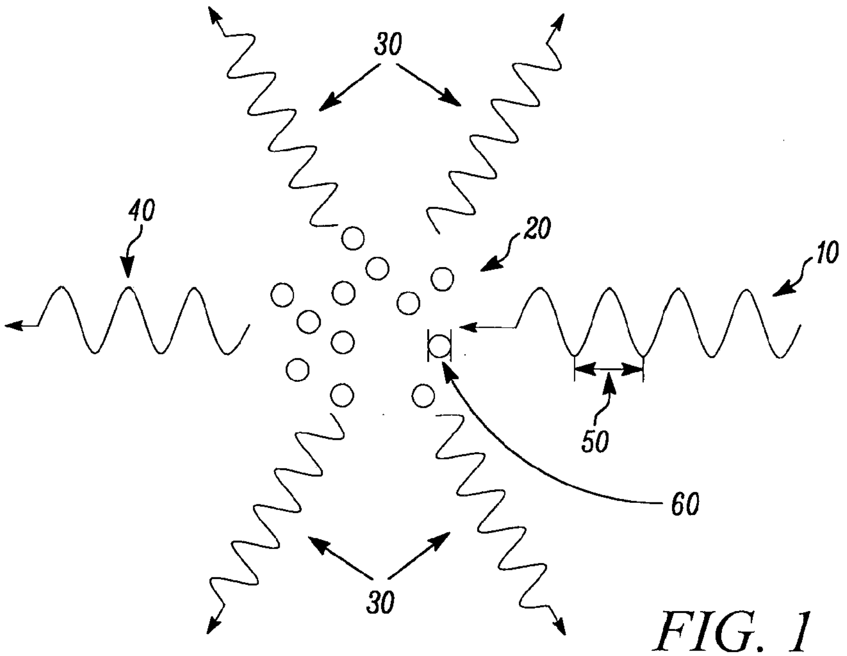
FIG. 1 is a cross-sectional view of light emitted from an LED having Rayleigh scattering from sub-wavelength particles.

Reference will now be made in detail to the present preferred embodiments of the invention, examples of which are illustrated in the accompanying drawings. Wherever possible, the same reference numbers are used in the drawings and the description to refer to the same or like parts. According to the design characteristics, a detailed description of each preferred embodiment is given below.

FIG. 1 shows a cross-sectional view of light emitted from an LED being Rayleigh scattered from sub-wavelength particles 20 in accordance with a first embodiment. As shown in FIG. 1, typically the incoming light 10 will include a plurality of wavelength components, including a wavelength 50 based on the light-emitting material used within the LED (not shown). For example, in a typical LED emission spectrum, the wavelength 50 emitted from the LED corresponding to the color blue will be approximately 430 nm. As shown in FIG. 1, the incoming light 10 impinges on a dispersed set or plurality of particles 20 with an effective diameter 60. The effective diameter 60 is preferably a fraction of the dominant wavelength 50, which creates the condition for Rayleigh scattering of the incoming light 10. For example, the dispersed set of particles 20 can be 80 nm alumina particles. It can be appreciated that other suitable particles having an effective diameter 60, which is a fraction of the wavelength 50 of the emitting light source or LED and creates Rayleigh scattering can be used. It can be appreciated that the particles need not be spherical, or even approximately spherical, and that other shapes can be used such as disk or rod-shaped particles. As shown in FIG. 1, the short wavelength components 30 are scattered by the particles 20, while the transmitted light 40 having long wavelength components are substantially unaffected. The transmitted light 40 is thus enhanced in the color red relative to the incoming light 10, without significantly affecting light intensity.

Figure 2:
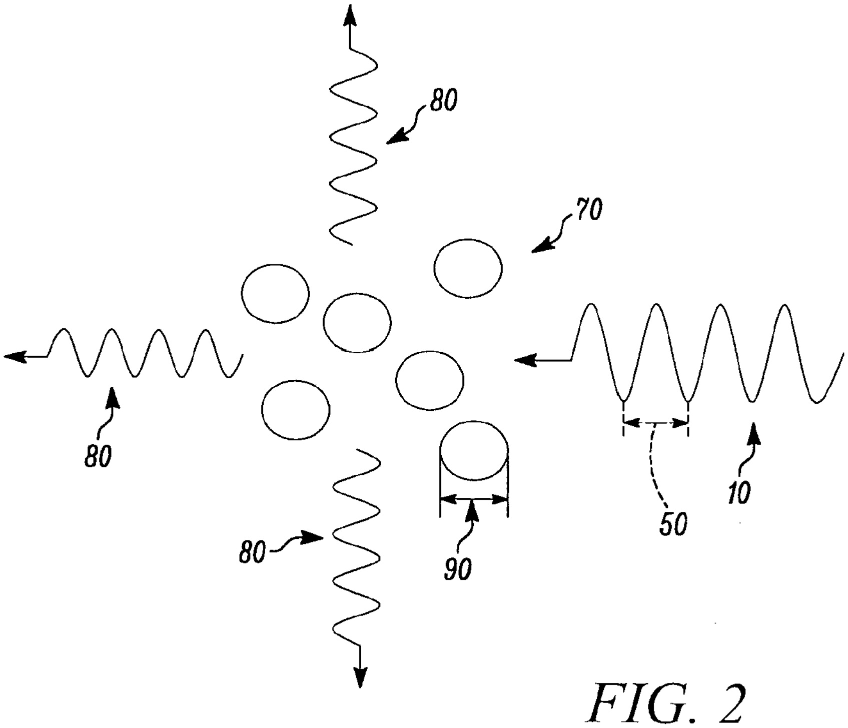
FIG. 2 is a cross-sectional view of light emitted from an LED having Mie scattering from supra-wavelength particles.

FIG. 2 shows a cross-sectional view of light emitted from an LED having Mie scattering from a plurality of supra-wavelength particles 70 and an equal scattering of each of the wavelengths 80 according to a further embodiment. Typically the incoming light 10 will include a plurality of wavelength components, including a wavelength 50 based on the light-emitting material used within the LED (not shown). For example, in a typical LED emission spectrum, the wavelength 50 emitted from the LED corresponding to the color blue will be approximately 430 nm. As shown in FIG. 2, the incoming light 10 impinges on a dispersed set or plurality of particles 70 having an effective diameter 90, wherein the effective diameter 90 is greater than a dominant wavelength 50 of light emitted from the LED. The effective diameter 90 of the dispersed particles 70 are preferably a size one to a few times larger than a dominant wavelength 50 of the light emitting source. For example, for an LED producing a blue light, the dispersed set of particles 70 can be alumina trihydrate having a diameter of approximately 1.1 microns. It can be appreciated that any suitable particles having an effective diameter 90, which is greater than the dominant wavelength 50 of the emitting light source or LED and creates Mie scattering can be used. It can be appreciated that the particles need not be spherical, or even approximately spherical, and that other shapes can be used such as disk or rod-shaped particles. This creates the condition for Mie scattering of the incoming light 10, wherein each of the incoming wavelengths 50 are scattered into an outgoing wavelength 80. The transmitted light or outgoing wavelengths 80 are thus dispersed in directions relative to the incoming light 10, without significantly affecting the light intensity.

Figure 3:
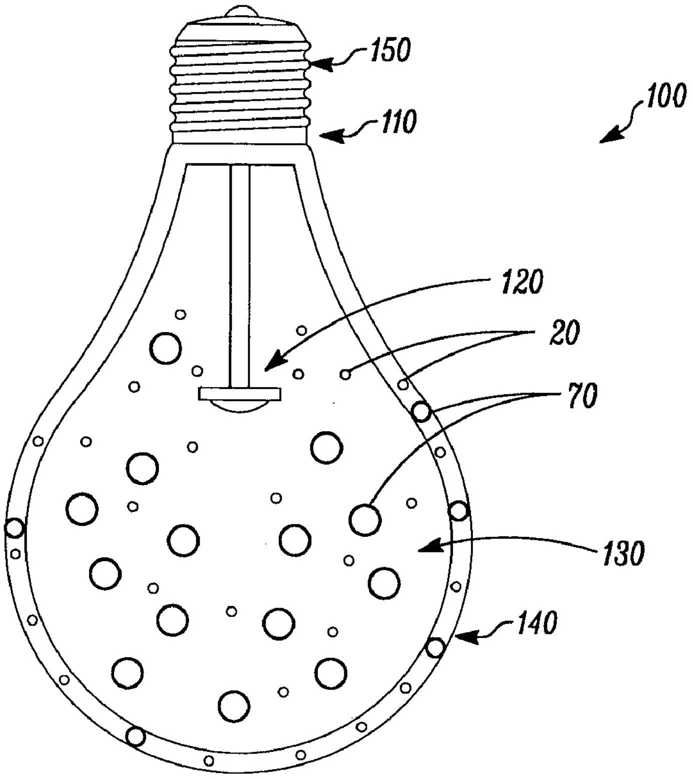
FIG. 3 is a cross-sectional view of an LED bulb showing an LED embedded in a bulb, and the bulb and its shell containing both Rayleigh and Mie scatterers.

FIG. 3 shows a cross-sectional view of a Rayleigh and Mie scattering system 100 having an LED bulb 10 with an LED 120 embedded in the bulb 110 in accordance with one embodiment. The bulb 100 comprises an LED 120 embedded in an inner portion 130 of the bulb 110 and having an outer surface or shell 140, and a base 150 having threads. The LED bulb 100 contains within it at least one LED 120, which is emitting light. As shown in FIG. 3, the inner portion 130 and the shell 140 of the bulb 110 containing a dispersed set of particles 20, 70, to produce scattering of the light produced from the LED 120 in accordance with both Rayleigh and Mie scattering. The light emitted from the LED 120 may contain several wavelengths, but is undesirably enhanced in the blue due to limitations in current LED technology. In order to preferentially scatter the light emitted from the LED 120, the bulb shell 140 and the body or inner portion 130 of the bulb 110 contain both dispersed set of particles 20, 70 having a wavelength corresponding to both Rayleigh scattering 20 and Mie scattering 70. In the case of a LED 120, which produces a blue light, the dispersed set of particles 20, 70 produces light, which is more like an incandescent than the light emitted from the LED 120, (i.e., does not appear to be as blue) as well as being more dispersed than the light emission angle from the LED 120 would otherwise permit. It can be appreciated that the bulb 110 can have more than one shell 140, and that one or more of the shells 140 or the inner portion 130 can contain dispersed particles 20, 70, which produce Rayleigh and/or Mie scattering.

Figure 4:
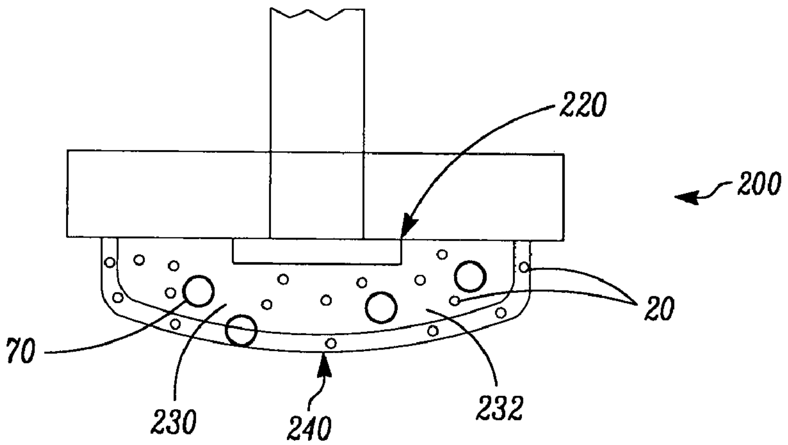
FIG. 4 is a cross-sectional view of an LED showing an LED die embedded in plastic, and the plastic and its shell containing both Rayleigh and Mie scatterers.

FIG. 4 shows a cross-sectional view of an LED 200 showing the LED die 220 embedded in a plastic material 230 in accordance with another embodiment. The LED die 220 is embedded in a plastic material 230 or inner portion 232 and includes a shell 240. The plastic material 230 and the shell 240 each contain a plurality of dispersed particles 20, 70 therein. The plurality of dispersed particles 20, 70 each having an effective diameter to produce Rayleigh and Mie scattering of the light produced by the LED 200. As shown in FIG. 4, the LED 200 contains within it at least one LED die 220, which is emitting a source of light having a defined set of wavelengths. Typically, the LED die 200 and the corresponding source of light will contain many wavelengths, but is undesirably enhanced in the blue and ultraviolet due to limitations in current technology. The LED shell 240 typically is coated with a phosphor that converts some of the light to a lower frequency, making the light color closer to incandescent, but still undesirably enhanced in blue. In the LED 200, the shell 240 and the body of the LED 230 contain both dispersed particles 20, 70, each having an effective diameter 60, 90 to produce Rayleigh and Mie scatterering of the source of light. The result is that the light emitted from the LED 200 is both less blue and more incandescent than the light emitted from the LED die 220, as well as being more dispersed than the light emission angle from the LED die 220 would otherwise permit. The addition of the dispersed particles 20, 70, can be in addition to the phosphor and optics that may be normally added to the LED 200.

It will be apparent to those skilled in the art that various modifications and variation can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED bulb, comprising:

a base having threads;

a bulb shell connected to the base and enclosing an inner portion of the LED bulb;

a plurality of particles disposed within the bulb shell;

at least one LED centrally located in the inner portion of the LED bulb; and wherein said plurality of particles comprises:

a first set of particles that preferentially scatters short wavelength components of the light emitted from the at least one LED, where the particles of the first set have an effective diameter that is a fraction of a dominant wavelength of the light emitted from the at least one LED; and a second set of particles that disperses the light emitted from the at least one LED, wherein the particles of the second set comprise a different material than the particles of the first set and have an effective diameter equal to or greater than the dominant wavelength of the light emitted from the at least one LED, and wherein portions of both the first set of particles and the second set of particles are intermixed and dispersed throughout the inner portion of the LED bulb.

2. The LED bulb of claim 1, wherein the first set of particles preferentially scatters short wavelength components of the light emitted from the at least one LED by Rayleigh scattering.

3. The LED bulb of claim 1, wherein the second set of particles disperses the light emitted from the at least one LED by Mie scattering.

4. The LED bulb of claim 1, wherein the bulb shell has a thickness and at least a portion of the plurality of particles is dispersed within the thickness of the bulb shell.

5. The LED bulb of claim 1, wherein the light emitted from the at least one LED has a wavelength of about 430 nanometers.

6. The LED bulb of claim 1, wherein the first set of particles is alumina particles.

7. The LED bulb of claim 1, wherein the first set of particles has particles with an effective diameter of about 80 nanometers.

8. The LED bulb of claim 1, wherein the plurality of particles has particles with at least one of the shapes selected from the group consisting of spherical, approximately spherical, disk-shaped, and rod-shaped, or any combination thereof.

9. The LED bulb of claim 1, wherein the second set of particles is alumina trihydrate particles.

10. The LED bulb of claim 1, wherein the second set of particles has particles with an effective diameter of about 1.1 microns.

11. The LED bulb of claim 1, wherein the bulb shell contains a phosphor.

12. The LED bulb of claim 1, further comprising optics to disperse the light emitted from the at least one LED.

13. The LED bulb of claim 1, wherein the at least one LED is a blue LED.

14. An LED bulb, comprising:

a base having threads;

a bulb shell connected to the base and enclosing an inner portion of the LED bulb;

a plurality of particles disposed within the bulb shell;

at least one blue LED centrally located in the inner portion of the LED bulb; and wherein said plurality of particles comprises:

a first set of particles that preferentially scatters short wavelength components of the light emitted from the at least one blue LED, where the particles of the first set have an effective diameter that is a fraction of a dominant wavelength of the light emitted from the at least one blue LED; and a second set of particles that disperses the light emitted from the at least one blue LED, wherein the particles of the second set comprise a different material than the particles of the first set and have an effective diameter equal to or greater than the dominant wavelength of the light emitted from the at least one blue LED, and wherein portions of both the first set of particles and the second set of particles are intermixed and dispersed throughout the inner portion of the LED bulb.

15. The LED bulb of claim 14, wherein the second set of particles has particles with an effective diameter of about 1.1 microns.

16. The LED bulb of claim 14, wherein the first set of particles has particles with an effective diameter of about 80 nanometers.

17. The LED bulb of claim 14, wherein the bulb shell contains a phosphor.

18. A method of making an LED bulb, comprising:

connecting a bulb shell to base to enclose an inner portion of the LED bulb, wherein at least one LED is centrally located in the inner portion of the LED bulb; and disposing a plurality of particles within the bulb shell, wherein said plurality of particles comprises:

a first set of particles that preferentially scatters short wavelength components of the light emitted from the at least one LED, where the particles of the first set have an effective diameter that is a fraction of a dominant wavelength of the light emitted from the at least one LED; and a second set of particles that disperses the light emitted from the at least one LED, wherein the particles of the second set comprise a different material than the particles of the first set and have an effective diameter equal to or greater than the dominant wavelength of the light emitted from the at least one LED, and wherein portions of both the first set of particles and the second set of particles are intermixed and dispersed throughout the inner portion of the LED bulb.

19. The method of claim 18, wherein the second set of particles is alumina trihydrate particles.

20. The method of claim 18, wherein the second set of particles has particles with an effective diameter of about 1.1 microns.

21. The method of claim 18, wherein the light emitted from the at least one LED has a wavelength of about 430 nanometers.

22. The method of claim 18, wherein the first set of particles is alumina particles.

23. The method of claim 18, wherein the first set of particles has particles with an effective diameter of about 80 nanometers.

24. The method of claim 18, wherein the bulb shell contains a phosphor.

* * * * *

UNITED STATES PATENT AND TRADEMARK OFFICE

CERTIFICATE OF CORRECTION

PATENT NO. : 8,193,702 B2
APPLICATION NO. : 12/299088
DATED : June 5, 2012
INVENTOR(S) : Ronald J. Lenk et al.

It is certified that error appears in the above-identified patent and that said Letters Patent is hereby corrected as shown below:

In the Specifications:

In column 1, line 10, delete "X371" and insert -- §371 --, therefor.

In column 2, line 31, delete "faction" and insert -- fraction --, therefor.

In column 4, line 57, delete "10" and insert -- 110 --, therefor.

In column 5, line 37, delete "scatterering" and insert -- scattering --, therefor.

Signed and Sealed this
Twenty-second Day of April, 2014

Michelle K. Lee

Michelle K. Lee
*Deputy Director of the United States Patent and Trademark Office*